US006982900B2

(12) United States Patent
Hirabayashi (10) Patent No.: US 6,982,900 B2
(45) Date of Patent: Jan. 3, 2006

(54) SEMICONDUCTOR INTEGRATED CIRCUIT DEVICE

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/853,193

(22) Filed: May 26, 2004

(65) Prior Publication Data

US 2005/0174833 A1 Aug. 11, 2005

(30) Foreign Application Priority Data

Feb. 5, 2004 (JP) .............................. 2004-029556

(51) Int. Cl.
*G11C 11/00* (2006.01)
(52) U.S. Cl. ............. 365/154; 365/185.09; 365/189.04
(58) Field of Classification Search ................ 365/154, 365/185.09, 185.17, 185.14, 185.05, 189.04, 365/185.03
See application file for complete search history.

(56) References Cited

U.S. PATENT DOCUMENTS

| 5,058,116 | A |   | 10/1991 | Chao et al. |
| 5,724,285 | A | * | 3/1998  | Shinohara ............... 365/185.25 |
| 5,793,774 | A | * | 8/1998  | Usui et al. ................. 714/719 |
| 6,496,897 | B2 | * | 12/2002 | Ware et al. ................. 711/105 |
| 6,614,685 | B2 | * | 9/2003  | Wong ...................... 365/185.11 |
| 2003/0093744 | A1 | * | 5/2003 | Leung et al. ............... 714/763 |
| 2005/0036371 | A1 | * | 2/2005 | Kushida ..................... 365/201 |

OTHER PUBLICATIONS

Kazutami Arimoto, et al., "A Speed-Enhanced DRAM Array Architecture With Embedded ECC", IEEE Journal of Solid-State Circuits, vol. 25, No. 1, Feb. 1990, pp. 11-17.
U.S. Appl. No. 10/853,193, filed May 26, 2004, Hirabayashi.
U.S. Appl. No. 10/930,767, filed Sep. 1, 2004, Hirabayashi.

* cited by examiner

*Primary Examiner*—Richard Elms
*Assistant Examiner*—Dang T. Nguyen
(74) *Attorney, Agent, or Firm*—Oblon, Spivak, McClelland, Maier & Neustadt, P.C.

(57) ABSTRACT

A semiconductor integrated circuit device includes a data bit storage memory which stores data bits, a code bit storage memory which stores code bits, and an ECC circuit. The code bit storage memory is controlled independently from the data bit storage memory. The ECC circuit corrects an error of at least one bit contained in one of the data bits and code bits by use of the data bit and code bit. The operation of writing the code bit corresponding to the data bit into the code bit storage memory when a data write command is received is performed at least one cycle after the data bit is written into the data bit storage memory.

18 Claims, 7 Drawing Sheets

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2004-029556, filed Feb. 5, 2004, the entire contents of which are incorporated herein by reference.

BACKGROUND OF THE INVENTION

1. Field of the Invention

This invention relates to a semiconductor integrated circuit device, and more particularly to a semiconductor integrated circuit device having an ECC circuit.

2. Description of the Related Art

The storage node capacity of each of the cells which configure a memory is reduced by the miniaturization of elements concurrent with the development of semiconductor device technology, and therefore, soft errors of the memory develop into a serious problem. As a countermeasure against soft errors, an ECC circuit (Error Correcting Code) circuit is often mounted on a memory section in the chip. A memory having an ECC circuit mounted thereon stores checking code bits in addition to normal data bits, detects the presence or absence of an error in the data bits based on the value of the code bit and one of the bits in which the error occurs by use of the ECC circuit, corrects the error and outputs the error-corrected bit to the exterior. The number of error bits in the same word which the ECC can correct is determined according to a code used. Generally, a SEC-DED (Single Error Correction-Double Error Detection) code which can be used for 1-bit error correction or for two-bit error detection in addition to 1-bit error correction is widely used.

Figure 11:
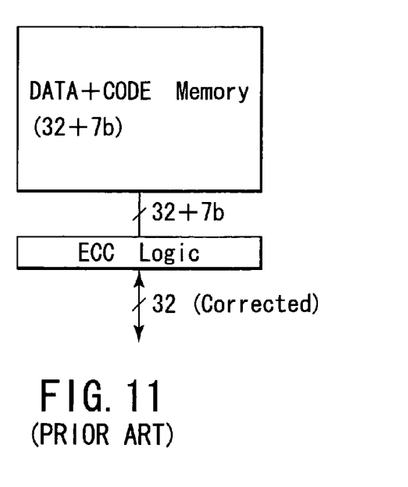
FIG. 11 is a block diagram showing a conventional semiconductor memory with an ECC circuit.

FIG. 11 shows the configuration of a typical semiconductor memory with an ECC circuit. The number of code bits required for correcting a 1-bit error varies according to the number of data bits. For example, in order to correct a 1-bit error in 32-bit data as shown in FIG. 11, a 7-bit code is required. Therefore, a total memory capacity which is 1.22 times the original memory capacity is required.

Figure 12:
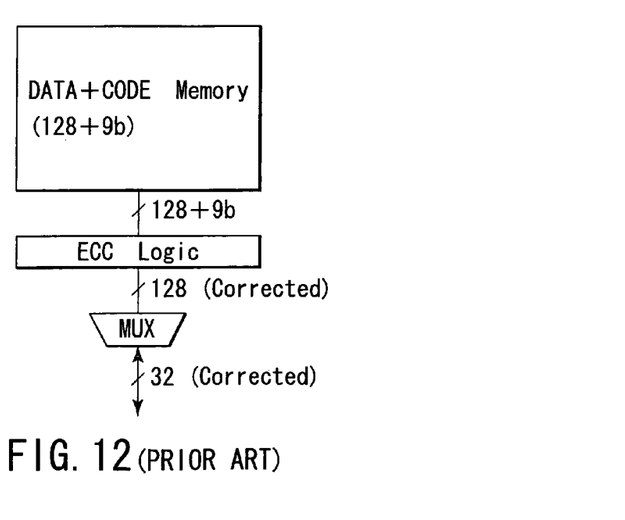
FIG. 12 is a block diagram showing a conventional semiconductor memory with an ECC circuit.

In order to suppress an increase in the memory capacity due to the code bits, a method for applying the ECC circuit to deal with data bits of a larger number in the memory is provided. For example, as shown in FIG. 12, an ECC circuit is used to deal with internal 128-bit data, select desired 32-bit data from the corrected 128 bit data and output the selected data. In this case, since a code of nine bits may be used for 128-bit data, the total memory capacity can be suppressed to 1.07 times the original memory capacity.

An example of a semiconductor memory to which the above ECC circuit is applied is described in document 1.

Document 1: Kazutami Arimoto et al., "A Speed-Enhanced DRAM Array Architecture with Embedded ECC", IEEE JOURNAL OF SOLID-STATE CIRCUITS, VOL. 25, NO. 1, February 1990, pp. 11–17.

BRIEF SUMMARY OF THE INVENTION

A semiconductor integrated circuit device according to an aspect of the present invention comprises a data bit storage memory which stores data bits, a code bit storage memory which stores code bits, the code bit storage memory being controlled independently from the data bit storage memory, and an ECC circuit which corrects an error of at least one bit contained in one of the data bits and code bits by use of the data bit and code bit, wherein an operation of writing the code bit corresponding to the data bit into the code bit storage memory is performed at least one cycle after the data bit is written into the data bit storage memory, when a data write command is received.

DETAILED DESCRIPTION OF THE INVENTION

If a semiconductor memory with an ECC circuit is configured as shown in FIG. 12, the operation becomes complicated and the operation speed is lowered. More specifically, the data readout operation is performed by first reading out (data of 128 bits+a code of 9 bits) and corrects an error in the data of 128 bits by use of the ECC circuit. Then, necessary data of 32 bits of the 128-bit data is output in a multiplex form. In the write operation, it is necessary to first read out the total data of 128 bits before writing 32-bit data, update new 32-bit data after the data is error-corrected by the ECC circuit, derive code bits for the new 128-bit data and then write the resultant data into a memory. Therefore, the operation speed is lowered.

There will now be explained embodiments of this invention with reference to the accompanying drawings. In this explanation, common reference symbols are attached to like portions throughout the drawings.

(First Embodiment)

Figure 1:
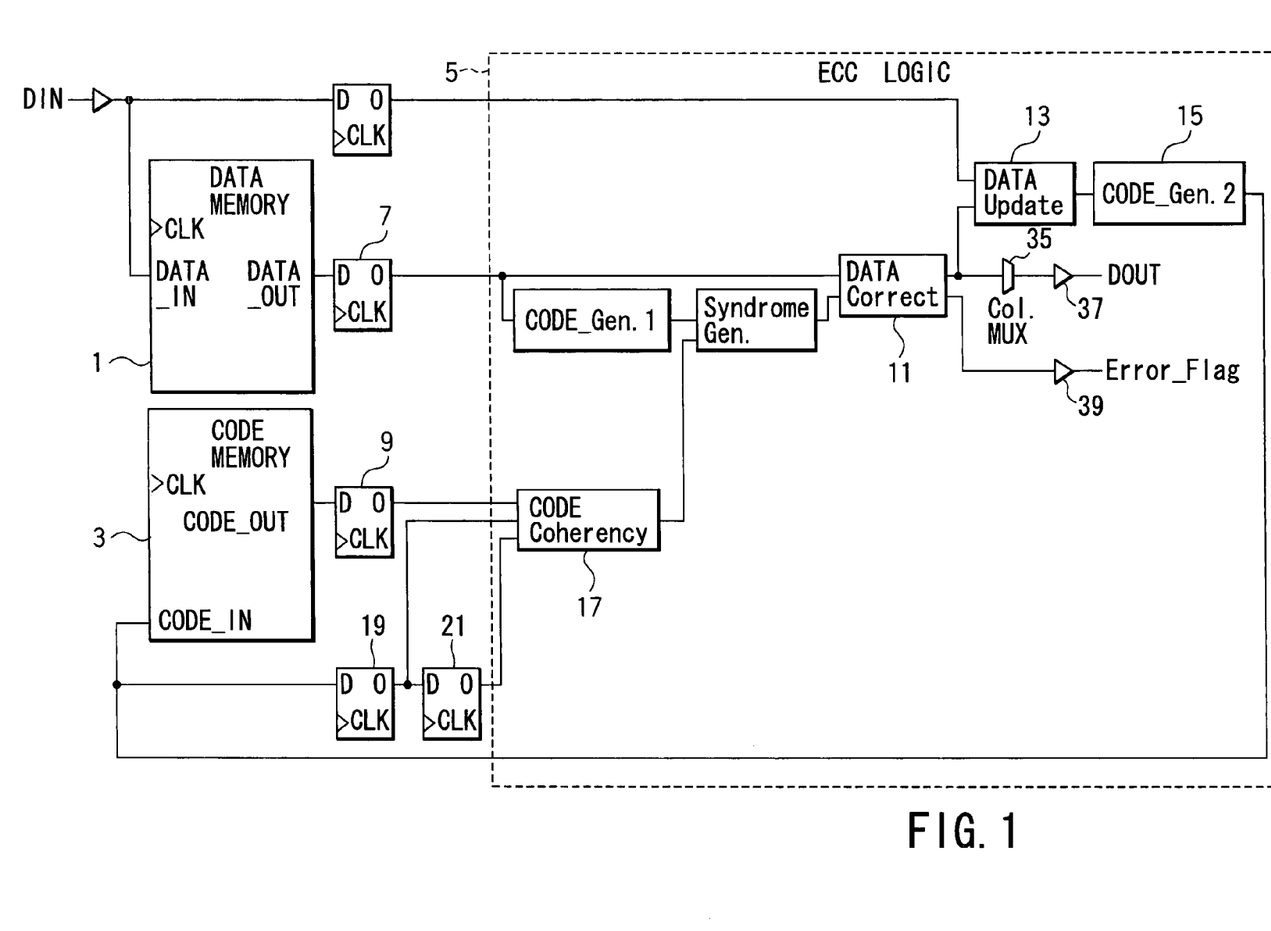
FIG. 1 is a block diagram showing an example of the configuration of a semiconductor memory with an ECC circuit according to a first embodiment of this invention.

FIG. 1 is a block diagram showing an example of the configuration of a semiconductor memory with an ECC circuit according to a first embodiment of this invention.

As shown in FIG. 1, the memory according to the first embodiment includes a data bit storage memory (DATA MEMORY) 1, code bit storage memory (CODE MEMORY) 3 and ECC circuit (ECC LOGIC) 5. The data bit storage memory 1 and code bit storage memory 3 are memories which can be independently operated (controlled).

(Read Operation)

First, data and a code are read out from the respective memories 1, 3 and stored into registers 7, 9 in a cycle in which a read command is received. In a next cycle, an ECC operation is performed based on the data and code stored in the registers 7, 9 (CODE_Gen.1 and Syndrome_Gen.) and if an error is detected in the data, the data is corrected in a data correction circuit (DATA Correct) 11 and then output (DOUT).

(Write Operation)

Figure 2:
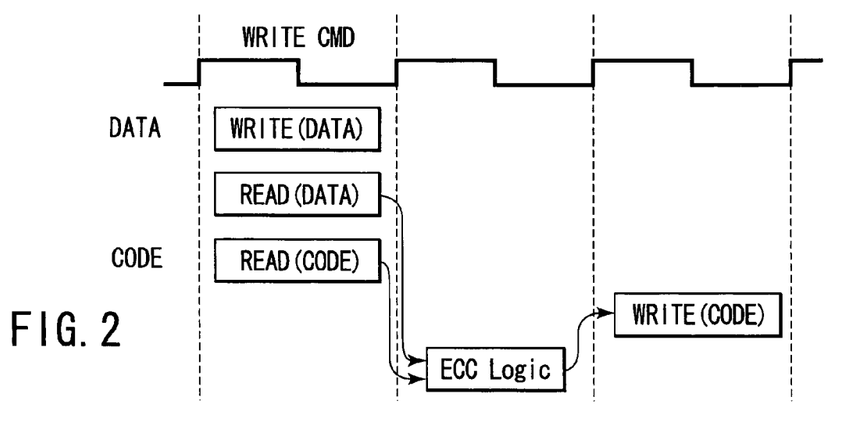
FIG. 2 is a waveform diagram showing an example of the operation waveform at the write time of the semiconductor memory with the ECC circuit according to the first embodiment of this invention.

FIG. 2 is a waveform diagram showing an example of the operation waveform at the write time of the semiconductor memory with the ECC circuit according to the first embodiment of this invention.

As shown in FIG. 2, first, data and a code of a corresponding address are read out from the respective memories 1, 3 before writing and stored into the registers 7, 9 in a cycle in which a write command (WRITE CMD) is received. Further, for example, input data (DIN) input from the exterior is written into the data bit storage memory 1. In a next cycle, an ECC operation is performed based on the data and code stored in the registers 7, 9 and if an error is detected in the data, the data is corrected in the data correction circuit 11. Then, the data is updated to input data (DIN) in a data updating circuit (DATA Update) 13 and a new code bit is calculated in a code generation circuit (CODE_Gen.2) 15 based on data obtained after updating. Further, in a next cycle, the newly derived code bit is written into the code bit storage memory 3.

By performing the above operation, the ECC operation and memory operation can be performed in parallel, and therefore, the operation speed can be enhanced.

As the operation of updating data according to the input data (DIN), there are two cases in which the entire portion of error-corrected data is updated according to the input data (DIN) and part of the error-corrected data is updated according to the input data (DIN). A typical example of the latter case is a case wherein a write mask is present in the input data (DIN). That is, the data updating (data rewriting) operation according to the input data (DIN) may be performed for at least part of the error-corrected data.

Figure 3:
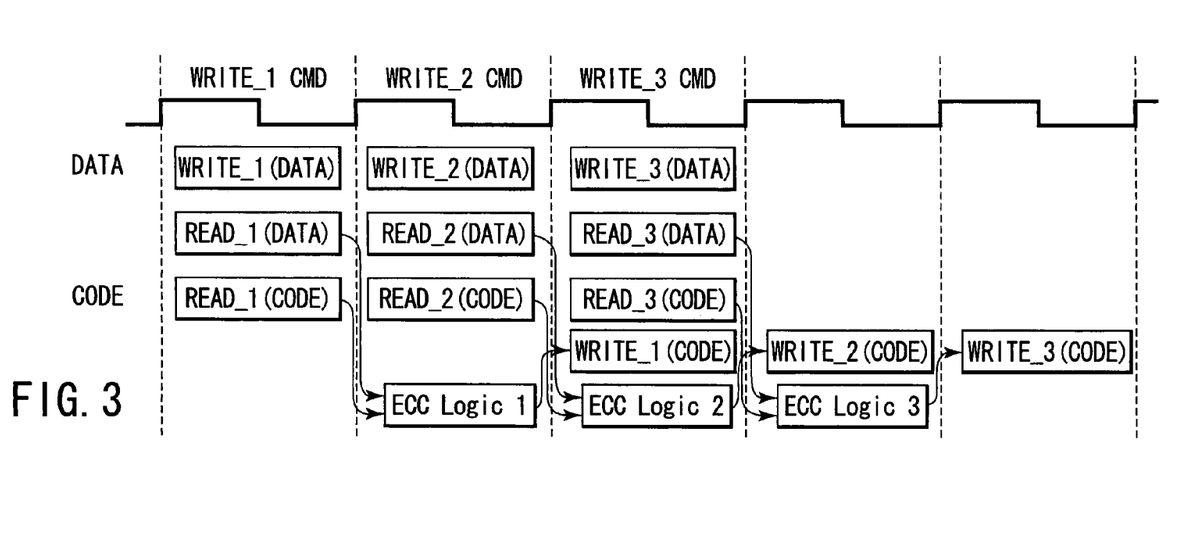
FIG. 3 is a waveform diagram showing another example of the operation waveform at the write time of the semiconductor memory with the ECC circuit according to the first embodiment of this invention.

FIG. 3 is a waveform diagram showing another example of the operation waveform at the write time of the semiconductor memory with the ECC circuit according to the first embodiment of this invention. The other example of the operation waveform indicates a case wherein write commands are successively input.

Figure 4:
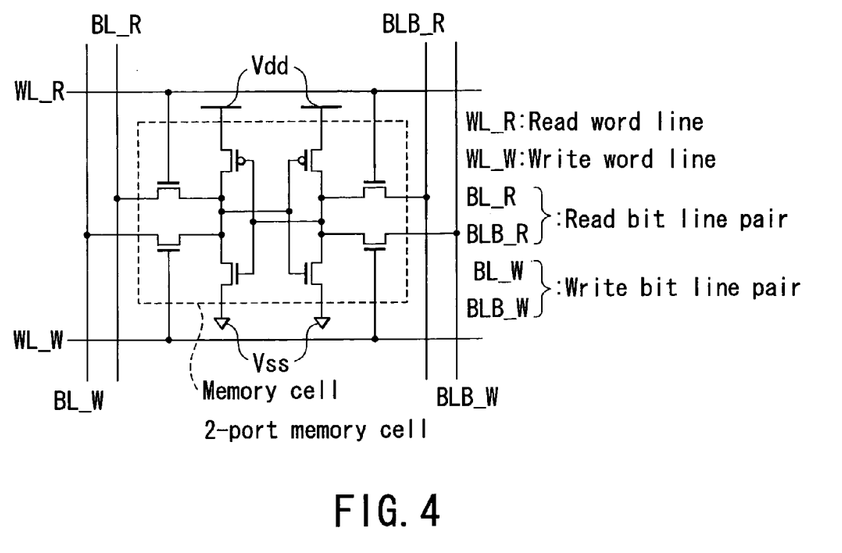
FIG. 4 is a circuit diagram showing an example of a 2-port memory cell.

As shown in FIG. 3, two operations of reading and writing are required in one cycle in both of the data bit storage memory 1 and code bit storage memory 3. Particularly, it is required to perform the read and write operations with respect to different addresses in the code bit storage memory 3, thus the operation speed is lowered. In order to prevent this problem, a memory which can perform the read and write operations in parallel may be provided in the code bit storage memory 3. One example of the memory is a 2-port memory. FIG. 4 shows an example of a memory cell (2-port memory cell) of a 2-port memory. The 2-port memory shown in FIG. 4 indicates an SRAM cell, but the memory cell is not limited to the SRAM cell.

Figure 5:
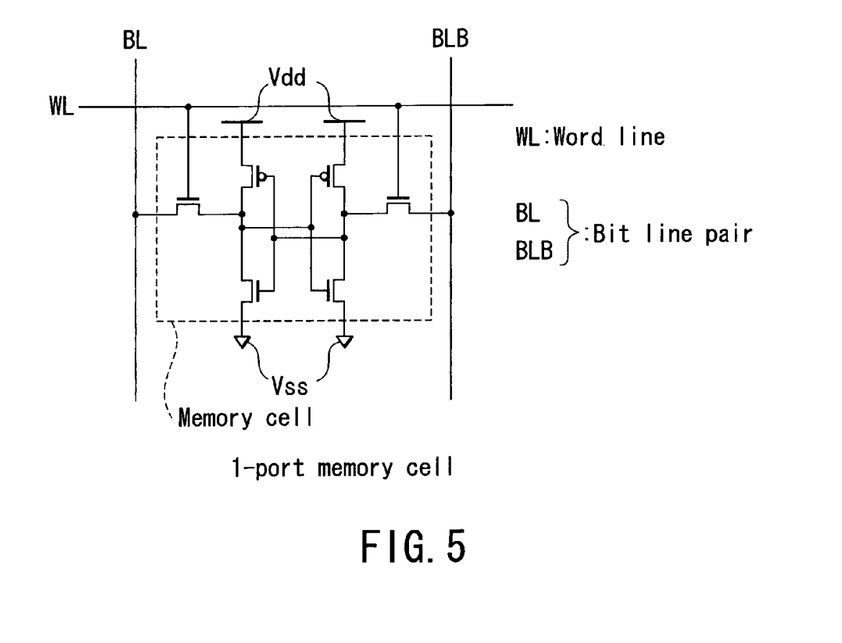
FIG. 5 is a circuit diagram showing an example of a 1-port memory cell.

The data bit storage memory 1 is not always necessary to use a memory, for example, a 2-port memory which can perform the read and write operations in parallel. For example, the data bit storage memory 1 may be a memory which can independently perform the read or write operation. One example of the memory is a 1-port memory. FIG. 5 shows an example of a memory cell (1-port memory cell) of a 1-port memory. Also, in this example, an SRAM cell is shown, but the memory cell is not limited to the SRAM cell.

As shown in FIG. 5, for example, the numbers of word lines and bit lines of the 1-port memory cell are each reduced by one and the number of selection transistors whose gates are connected to word lines is reduced by two in the case of an SRAM cell in comparison with those of the 2-port memory cell shown in FIG. 4. That is, the size of the 1-port memory cell can be easily reduced and the integration density thereof can be easily enhanced in comparison with those of the 2-port memory cell.

The storage capacity required for the data bit storage memory 1 is much larger than the storage capacity required for the code bit storage memory 3. For example, the area occupied by the data bit storage memory 1 is much larger than the area occupied by the code bit storage memory 3 in the semiconductor integrated circuit chip.

Therefore, for example, a memory which can independently perform the read or write operation or a 1-port memory is used as the data bit storage memory 1. Further, a memory which can perform the read and write operations in parallel or a 2-port memory is used as the code bit storage memory 3. Thus, in the semiconductor memory with the ECC circuit, the semiconductor integrated circuit chip can be miniaturized or the integration density of the semiconductor integrated circuit chip can be enhanced (the memory capacity can be increased) while a lowering in the operation speed is suppressed.

Further, in the semiconductor memory with the ECC circuit shown in FIG. 1, the operation of actually writing the code bit into the code bit storage memory 3 in the write operation is performed two cycles after a cycle in which the write command is received. Therefore, when a write command or read command with respect to a certain address is generated following after the write command with respect to the same address, a code bit used to cope with the first write operation is not written into the code bit storage memory 3 and an erroneous operation may occur. In order to prevent this, a coherency circuit (CODE Coherency) 17 is provided.

The code coherency circuit 17 compares an address in a present cycle with an address of a previous cycle one or two cycles prior to the present cycle, and a command. For example, if the address in the prior cycle coincides with the present address and the prior cycle is a write cycle, the code coherency circuit 17 uses a code bit from a code register 19 instead of a code bit output from the code bit storage memory 3 and performs the control operation to perform the ECC operation.

Further, if the address in the 2nd previous cycle coincides with the present address and the 2nd previous cycle is a write cycle, the code coherency circuit 17 uses a code bit from a code register 21 instead of a code bit output from the code bit storage memory and performs the control operation to perform the ECC operation.

Further, the semiconductor memory with the ECC circuit according to the first embodiment can output non-corrected data in a cycle in which the read command is received and output an error flag (Error_Flag) indicating whether error correction is made or not together with corrected data. Therefore, it can cope with a system which outputs non-corrected data to a system if error correction is less frequently made, continuously carries out the process and performs the re-process by use of corrected data in the next cycle only when an error occurs.

One concrete example of this system is explained in a third embodiment.

(Second Embodiment)

The semiconductor memory with the ECC circuit according to the first embodiment has a merit of shortening the cycle time, but corrected data is output in a cycle next to a cycle in which the read command is received in the read operation. A case wherein data is output in a cycle in which the read command is received is shown in the second embodiment.

Figure 6:
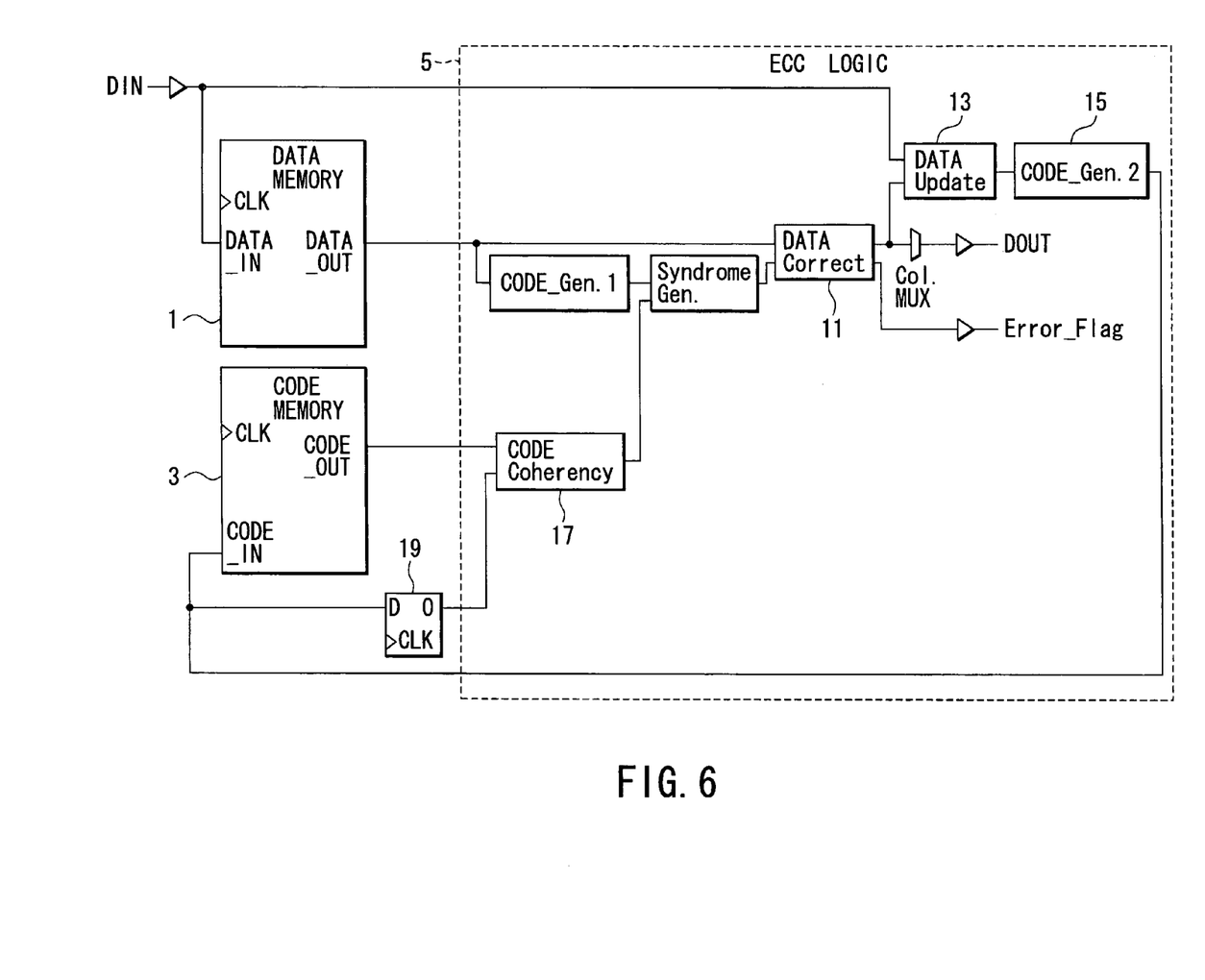
FIG. 6 is a block diagram showing an example of the configuration of a semiconductor memory with an ECC circuit according to a second embodiment of this invention.

FIG. 6 is a block diagram showing an example of the configuration of a semiconductor memory with an ECC circuit according to the second embodiment of this invention.

The configuration is explained below together with the operation.

(Read Operation)

First, data and a code are read out from memories 1, 3 in a cycle in which the read command is received, an ECC operation is performed based on the data and code, an error in the data is corrected and the thus corrected data is output (DOUT).

(Write Operation)

Figure 7:
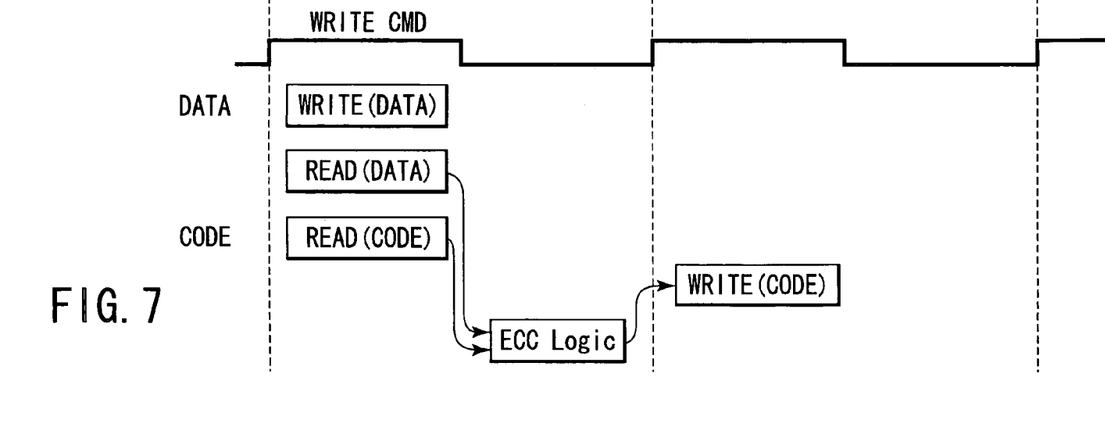
FIG. 7 is a waveform diagram showing an example of the operation waveform at the write time of the semiconductor memory with the ECC circuit according to the second embodiment of this invention.

FIG. 7 is a waveform diagram showing an example of the operation waveform at the write time of the semiconductor memory with the ECC circuit according to the second embodiment of this invention.

As shown in FIG. 7, first, the data and code of a corresponding address are read out from the respective memories 1, 3 before writing in a cycle in which a write command (WRITE CMD) is received. Then, the ECC operation is performed based on the data and code and if an error is detected in the data, data is corrected by a data correction circuit 11. After this, for example, data is updated to input data (DIN) input from the exterior in a data updating circuit (DATA Update) 13 and a code bit is newly derived in a code generation circuit (Code_Gen2) 15 based on data after updating. Further, the input data (DIN) input from the exterior is written into the data bit storage memory 1.

In a next cycle, the newly derived code bit is written into the code bit storage memory 3.

By performing the above operation, corrected data can be output in a cycle in which the read command is received.

Figure 8:
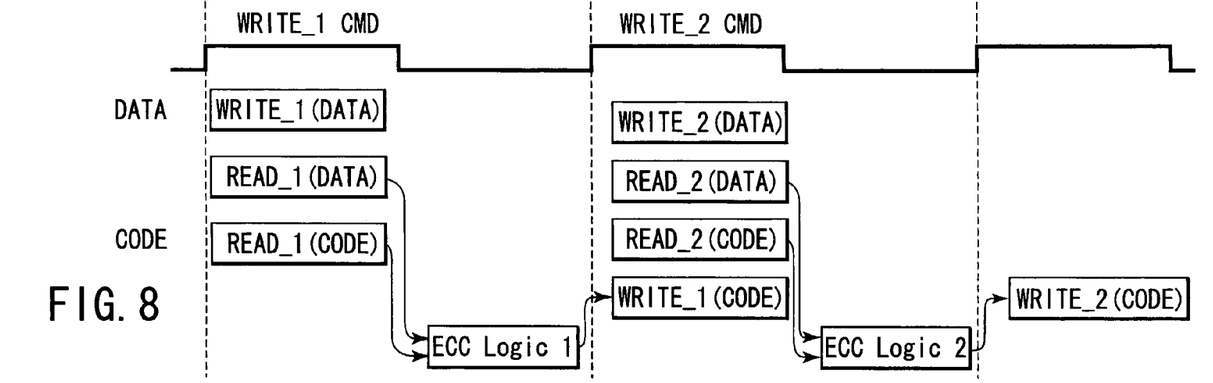
FIG. 8 is a waveform diagram showing another example of the operation waveform at the write time of the semiconductor memory with the ECC circuit according to the second embodiment of this invention.

FIG. 8 is a waveform diagram showing another example of the operation waveform at the write time of the semiconductor memory with the ECC circuit according to the second embodiment of this invention. This example of the operation waveform indicates a case wherein write commands are successively input in the memory according to the second embodiment.

As shown in FIG. 8, two operations of reading and writing are required in one cycle in both of the data bit storage memory 1 and code bit storage memory 3. Particularly, it is required to perform the read and write operations with respect to different addresses in the code bit storage memory 3, thus the operation speed may be lowered. In order to prevent this problem, like the first embodiment, a memory which can perform the read and write operations in parallel may be used as the code bit storage memory 3.

Further, in the second embodiment shown in FIG. 5, like the first embodiment, the operation of actually writing the code bit into the code bit storage memory 3 in the write operation is performed in the cycle after the cycle in which the write command is received. Therefore, like the first embodiment, in the second embodiment, a code coherency circuit (CODE Coherency) 17 is provided.

The code coherency circuit 17 compares an address of a present cycle with an address in the prior cycle, and a command. For example, if the address in the prior cycle coincides with the present address and the prior cycle is a write cycle, the code coherency circuit 17 uses a code bit from a code register 19 instead of a code bit output from the code bit storage memory 3 and performs the control operation to perform the ECC operation.

(Third Embodiment)

As is explained in the beginning of the second embodiment, the semiconductor memory with the ECC circuit according to the first embodiment outputs error-corrected data in the cycle next to the cycle in which the read command is received, for example. That is, outputting of the error-corrected data is delayed by one cycle, for example, after the read command is received. If data outputting is delayed by one cycle, for example, a case wherein the performance of a system is degraded can be considered.

However, if the frequency of error corrections, for example, for soft errors, is extremely low, the error correction is not required in most cases. Therefore, there occurs no problem in most systems even if the process is carried on by use of non-corrected data.

Figure 9:
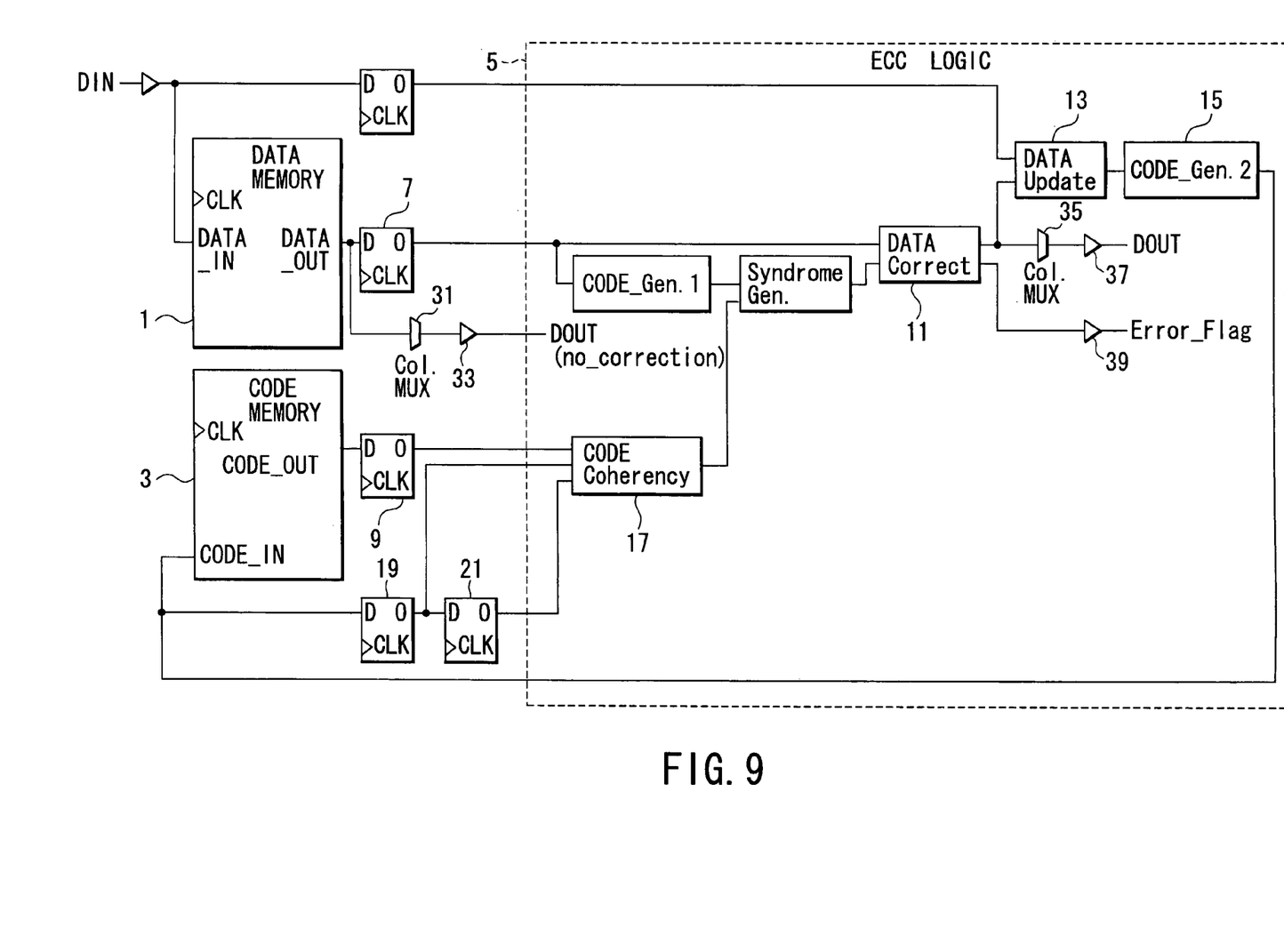
FIG. 9 is a block diagram showing an example of the configuration of a semiconductor memory with an ECC circuit according to a third embodiment of this invention.

FIG. 9 is a block diagram showing an example of the configuration of a semiconductor memory with an ECC circuit according to the third embodiment of this invention.

The configuration is explained below together with the operation.

Figure 10:
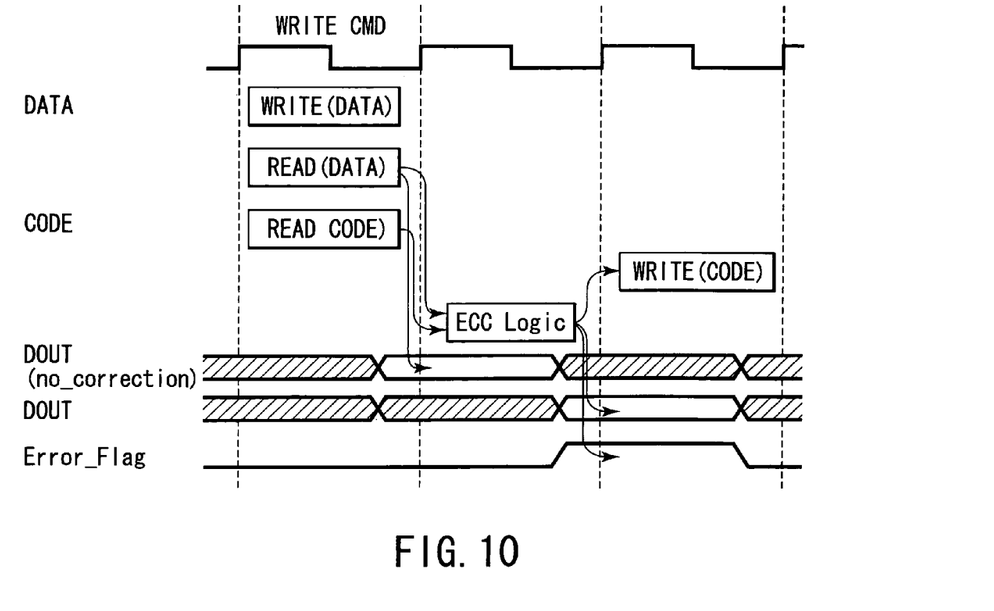
FIG. 10 is a waveform diagram showing an example of the operation waveform at the write time of the semiconductor memory with the ECC circuit according to the third embodiment of this invention.

FIG. 10 is a waveform diagram showing an example of the operation waveform at the write time of the semiconductor memory with the ECC circuit according to the third embodiment of this invention. The read operation also occurs at the write time, and therefore, the read operation is explained below by use of the operation waveform at the write time.

(Read Operation)

First, data and a code are read out from memories 1, 3 in a cycle in which the read command is received (in the case of FIG. 10, the write command (WRITE CMD) is described, but the write command may be read as the read command). A data bit read out from the data bit storage memory 1 is stored into a register 7 and non-corrected data is output from an output buffer 33 (DOUT(no_correction)) via a column multiplexer (Col. MUX) 31 in a cycle in which the read command is received. A code bit read out from the code bit storage memory 3 is stored into a register 9.

Next, like the first embodiment, the ECC operation is performed (CODE_Gen.1 and Syndrome_Gen.) based on the data bit read out from the register 7 and the code bit read out from the register 9 in a cycle next to the cycle in which the read command is received. Then, if an error is detected in the data, the data is corrected in a data correction circuit (DATA Correct) 11 and corrected data is output (DOUT) from an output buffer 37 via a column multiplexer (Col. MUX) 35. If error correction is made, an error flag (Error_Flag) indicating occurrence of error correction is output from an output buffer 39.

In the system, the process is carried on by use of non-corrected data (DOUT(non-correction)). In this case, however, if error correction is detected by use of an error flag, the re-process may be performed by use of corrected data (DATA) output in a cycle next to the cycle in which the read command is received.

The write operation in the third embodiment is the same as the write operation in the first embodiment.

In the third embodiment, a case wherein the output buffer 33 which outputs non-corrected data is provided separately from the output buffer 37 which outputs corrected data is explained. However, the buffers 33, 37 can be combined into one. Further, like the case of the buffers 33, 37, the column multiplexer 31 to which non-corrected data is input and the column multiplexer 35 to which corrected data is input can be combined into one.

According to the semiconductor memory with the ECC circuit according to each of the first to third embodiments of this invention, the cycle time can be shortened by delaying the code bit writing operation by one or two cycles with respect to the data bit writing operation. The cycle time can be further shortened by using a 2-port memory as the code bit storage memory 3.

According to the embodiments of this invention, a semiconductor memory with an ECC circuit which can suppress a lowering in the operation speed can be provided.

As described above, this invention is explained by use of the several embodiments, but this invention is not limited to the embodiments. When embodying this invention, this invention can be variously modified without departing from the technical scope thereof.

Further, the above embodiments can be independently performed, but they can be adequately combined and performed.

In addition, the above embodiments contain inventions of various stages and inventions of various stages can be extracted by adequately combining a plurality of constituents disclosed in the embodiments.

Further, the above embodiments are explained by applying this invention to the semiconductor memory, but this invention is not limited to the semiconductor memory. A semiconductor integrated circuit device containing a semiconductor memory, for example, a processor, system LSI or the like is also contained in the scope of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a data bit storage memory which stores data bits;
   a code bit storage memory which stores code bits, the code bit storage memory being controlled independently from the data bit storage memory; and
   an ECC circuit which corrects an error of at least one bit contained in one of the data bits and code bits by use of the data bit and code bit;
   wherein an operation of writing the code bit corresponding to the data bit into the code bit storage memory is performed at least one cycle after the data bit is written into the data bit storage memory, when a data write command is received.

2. The device according to claim 1, wherein a data bit of a corresponding address is read out from the data bit storage memory and a corresponding code bit is read out from the code bit storage memory when a data read command is received, the ECC circuit corrects an error in one of the code bit and the data bit based on the readout data bit and code bit and outputs the corrected data in one of a cycle in which the data read command is received and a cycle next to the cycle, a data bit of a corresponding address is read out from the data bit storage memory and a corresponding code bit is read out from the code bit storage memory when the data write command is received, the ECC circuit corrects an error in one of the code bit and the data bit based on the readout data bit and code bit in one of a cycle in which the data write command is received and a cycle next to the cycle, rewrites at least part of the error-corrected data to write data, newly derives a code bit and writes the newly derived code bit into the code bit storage memory in a cycle one cycle or two cycles after the cycle in which the data write command is received.

3. The device according to claim 2, further comprising:
   a code register which stores a code bit input to the code bit storage memory, the code register storing an address in a cycle at least one cycle before the present cycle and a command in a cycle one cycle before the present cycle,
   wherein data of the code register is output to the ECC circuit in a case where an address of the present cycle coincides with the stored address and the stored command is a write command, and a code bit output from the code bit storage memory is output to the ECC circuit in a case different from the above case.

4. The device according to claim 1, wherein a data bit of a corresponding address is read out from the data bit storage memory and a corresponding code bit is read out from the code bit storage memory when a data read command is received, the readout data bit and code bit are stored into a register, and the ECC circuit corrects an error in one of the code bit and the data bit based on the data bit and code bit stored in the register and outputs the corrected data in a cycle next to the cycle in which the data read command is received and outputs a flag signal indicating whether error correction is made or not.

5. The device according to claim 2, wherein a data bit of a corresponding address is read out from the data bit storage memory and a corresponding code bit is read out from the code bit storage memory when a data read command is received, the readout data bit and code bit are stored into a register, and the ECC circuit corrects an error in one of the code bit and the data bit based on the data bit and code bit stored in the register and outputs the corrected data in a cycle next to the cycle in which the data read command is received and outputs a flag signal indicating whether error correction is made or not.

6. The device according to claim 3, wherein a data bit of a corresponding address is read out from the data bit storage memory and a corresponding code bit is read out from the code bit storage memory when a data read command is received, the readout data bit and code bit are stored into a register, and the ECC circuit corrects an error in one of the code bit and the data bit based on the data bit and code bit stored in the register and outputs the corrected data in a cycle next to the cycle in which the data read command is received and outputs a flag signal indicating whether error correction is made or not.

7. The device according to claim 1, wherein the code bit storage memory is a memory which performs the read operation and write operation in parallel.

8. The device according to claim 2, wherein the code bit storage memory is a memory which performs the read operation and write operation in parallel.

9. The device according to claim 3, wherein the code bit storage memory is a memory which performs the read operation and write operation in parallel.

10. The device according to claim 4, wherein the code bit storage memory is a memory which performs the read operation and write operation in parallel.

11. The device according to claim 5, wherein the code bit storage memory is a memory which performs the read operation and write operation in parallel.

12. The device according to claim 6, wherein the code bit storage memory is a memory which performs the read operation and write operation in parallel.

13. The device according to claim 7, wherein the data bit storage memory is a memory which independently performs one of the read operation and write operation.

14. The device according to claim 8, wherein the data bit storage memory is a memory which independently performs one of the read operation and write operation.

15. The device according to claim 9, wherein the data bit storage memory is a memory which independently performs one of the read operation and write operation.

16. The device according to claim 10, wherein the data bit storage memory is a memory which independently performs one of the read operation and write operation.

17. The device according to claim 11, wherein the data bit storage memory is a memory which independently performs one of the read operation and write operation.

18. The device according to claim 12, wherein the data bit storage memory is a memory which independently performs one of the read operation and write operation.

* * * * *